(12) United States Patent  
Casey

(10) Patent No.: US 11,191,170 B2  
(45) Date of Patent: Nov. 30, 2021

(54) SILICONE CONTACT ELEMENT

(71) Applicant: Michael Casey, Scottsdale, AZ (US)

(72) Inventor: Michael Casey, Scottsdale, AZ (US)

( * ) Notice: Subject to any disclaimer, the term of this patent is extended or adjusted under 35 U.S.C. 154(b) by 0 days.

(21) Appl. No.: 16/936,145

(22) Filed: Jul. 22, 2020

(65) Prior Publication Data

US 2021/0029835 A1    Jan. 28, 2021

Related U.S. Application Data

(60) Provisional application No. 62/877,636, filed on Jul. 23, 2019.

(51) Int. Cl.
| | |
|---|---|
| *H03K 3/42* | (2006.01) |
| *H05K 3/42* | (2006.01) |
| *H05K 1/02* | (2006.01) |
| *H01R 13/24* | (2006.01) |
| *H05K 3/00* | (2006.01) |
| *H05K 3/10* | (2006.01) |

(52) U.S. Cl.
CPC ......... *H05K 3/424* (2013.01); *H01R 13/2414* (2013.01); *H05K 1/0296* (2013.01); *H05K 3/0047* (2013.01); *H05K 3/107* (2013.01)

(58) Field of Classification Search
CPC .............. H01R 13/24; H01R 13/2407; H01R 13/2414; H05K 1/0296; H05K 3/0047; H05K 3/107; H05K 3/424
See application file for complete search history.

(56) References Cited

U.S. PATENT DOCUMENTS

| | | | | |
|---|---|---|---|---|
| 3,971,610 A | * | 7/1976 | Buchoff | G04C 3/005 439/75 |
| 5,624,268 A | * | 4/1997 | Maeda | H01L 23/49827 439/66 |
| 6,348,659 B1 | * | 2/2002 | Crotzer | H01R 13/2414 174/68.1 |
| 6,549,636 B2 | | 4/2003 | Fujimoto et al. | |
| 7,448,883 B2 | * | 11/2008 | Alden, III | H05K 7/1061 439/91 |
| 7,585,173 B2 | * | 9/2009 | Hilty | H01R 13/2414 439/66 |
| 7,726,976 B2 | * | 6/2010 | Mason | H05K 7/1061 439/66 |
| 9,876,298 B2 | * | 1/2018 | Mason | H01R 12/78 |
| 2004/0171287 A1 | | 9/2004 | Spiropoulos | |

FOREIGN PATENT DOCUMENTS

| | | | |
|---|---|---|---|
| JP | 2004079277 A | * | 3/2004 |
| JP | 2004311947 A | * | 11/2004 |

* cited by examiner

*Primary Examiner* — Carl J Arbes  
(74) *Attorney, Agent, or Firm* — Brown & Michaels, PC

(57) ABSTRACT

A contact element for use between electronic components like computer chips and printed circuit boards, or the connection between an electronic component in a test socket to provide high current, high density, and high frequency connections between the electronic components. The contact element preferably achieves a good connection between electrical components when they are connected and pressed together. The contact element is preferably made of a conductive silicone rubber which has been plated.

16 Claims, 6 Drawing Sheets

SILICONE CONTACT ELEMENT

REFERENCE TO RELATED APPLICATIONS

This application claims one or more inventions which were disclosed in Provisional Application No. 62/877,636, filed Jul. 23, 2019, entitled "SILICONE CONTACT ELEMENT". The benefit under 35 USC § 119(e) of the United States provisional application is hereby claimed, and the aforementioned application is hereby incorporated herein by reference.

BACKGROUND OF THE INVENTION

Field of the Invention

The invention pertains to the field of contact elements. More particularly, the invention pertains to contact elements for use between electronic components like computer chips and printed circuit boards, or the connection between an electronic component in a test socket to provide high current, high density, and high frequency connections between the electronic components.

Description of Related Art

Referring to FIG. 1, prior art LGA (Land Grid Array) assemblies are used to interconnect an IC (Integrated Circuit) package A having a plurality of flat contact pads or solder bumps B formed on a bottom surface, to contact pads C arranged in a regular pattern on a surface of PCB (Printed Circuit Board) D.

Prior art LGA assemblies are known which include an insulative housing E and a plurality of resilient conductive contacts F received in passageways formed in housing E. Resilient conductive contacts F typically have exposed portions at the upper and lower surfaces of insulative housing E for engaging flat contact pads B, C. When IC package A is accurately positioned in overlying aligned engagement with PCB D, such that conductive pads B engage conductive pads C, a normal force is applied to the exposed portions of each resilient conductive contact F to electrically and mechanically engage the respective contact pads B, C.

The resilient conductive contacts F associated with prior art LGA's have had a variety of shapes. A commonly used form of resilient conductive contact includes two free ends connected by a curved, resilient portion which provides for the storage of elastic energy during engagement with the IC package A and PCB D. Prior art resilient conductive contacts F may be a single metal structure in the form of a spring to provide the required elastic response during service, while also serving as a conductive element for electrical connection. Alternatively, contact buttons have been developed in which a connector is wound around, embedded, or otherwise engaged with a dielectric core, which often provides for elastic energy storage during operation with the conductor merely providing an electrical conduction pathway. Typically, a combination of barrier metal and noble metal platings are applied to the surface of the spring for corrosion prevention and for electrical contact enhancement. It is often the case that these platings provide improved electrical conduction only along the surface of the spring.

A problem in the art exists, in that, a conductive contact in the form of a single conductor spring for attaining high compliance also has a high resistance and a high inductance. Further, a contact, in the form of multiple conductors in a bunched wire bundle, or in the form of a conductor structure embedded in a polymer core, is made with lower resistance and inductance than a single conductor spring, but requires a high contact force for deflection, and is unable to attain high compliance. Further, one problem in the art exists in that a good material for the construction of a spring, such as a high strength steel, is not a very good electrical conductor. On the other hand, a good electrical conductor, such as a copper alloy or precious metal, often does not provide adequate spring properties.

There is a need for a more resilient conductive contact which incorporates the seemingly opposing requirements of good spring properties, temperature resistance, and high conductivity, but without the need for any integral supporting structure. Therefore, an improved electrical contact for use in an LGA socket or electrical connector is needed which can overcome the drawbacks of conventional electrical contacts.

Thus, it is desirable that a good electrical contact element possesses the following attributes: (a) usable for both a production package, as well as, test and burn-in sockets, where the latter use requires high durability; (b) a large elastic compliance range and low contact forces; (c) capable of transmitting high frequency signals and high currents; (d) capable of withstanding high operating temperatures; (e) fine pitch or density; and (f) exhibiting high durability, i.e. >500K repeated deflections.

SUMMARY OF THE INVENTION

A contact element for use between electronic components like computer chips and printed circuit boards, or the connection between an electronic component in a test socket, to provide high current, high density, and high frequency connections between the electronic components. The contact element preferably achieves a good connection between electrical components when the electrical components are connected and pressed together. The contact element is preferably made of a silicone rubber which has been plated chemically and/or electrically.

DETAILED DESCRIPTION OF THE INVENTION

Figure 1:
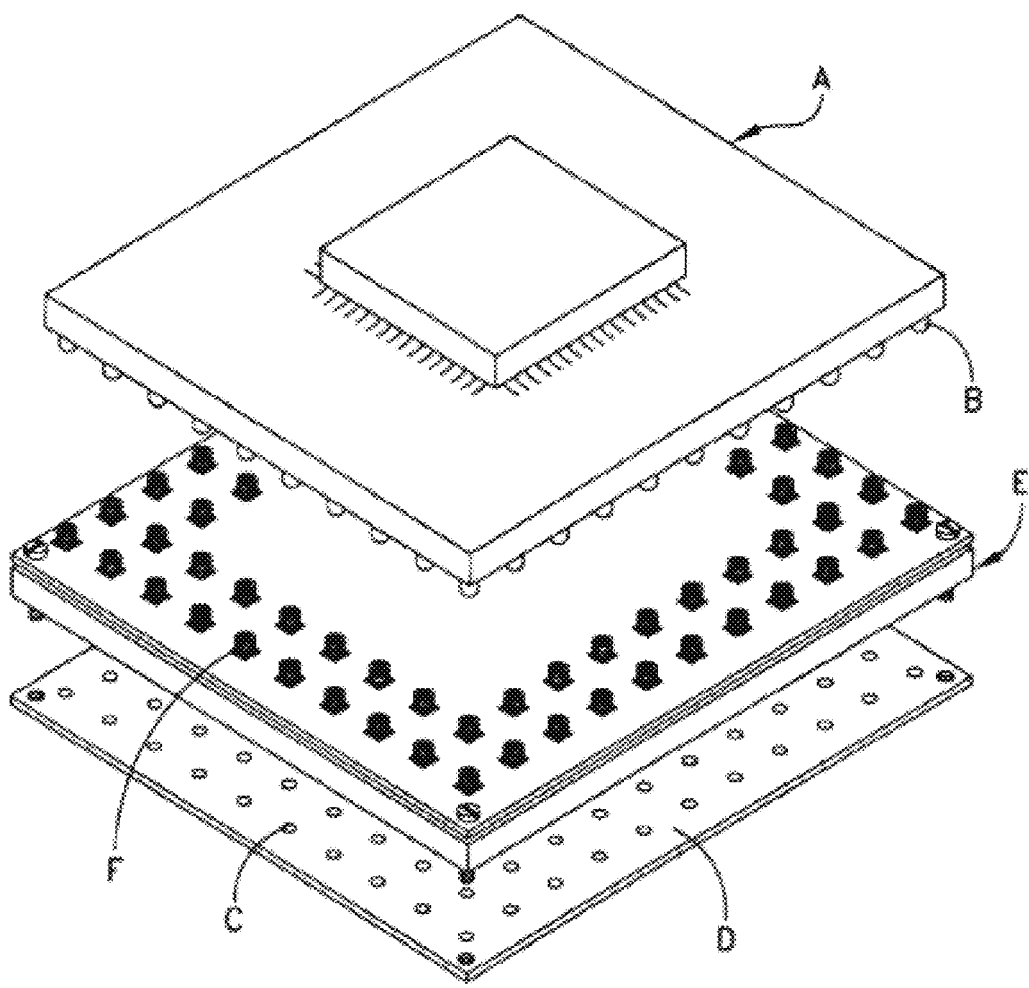
FIG. 1 is a perspective exploded view of a prior art land grid array assembly.
Figure 2:
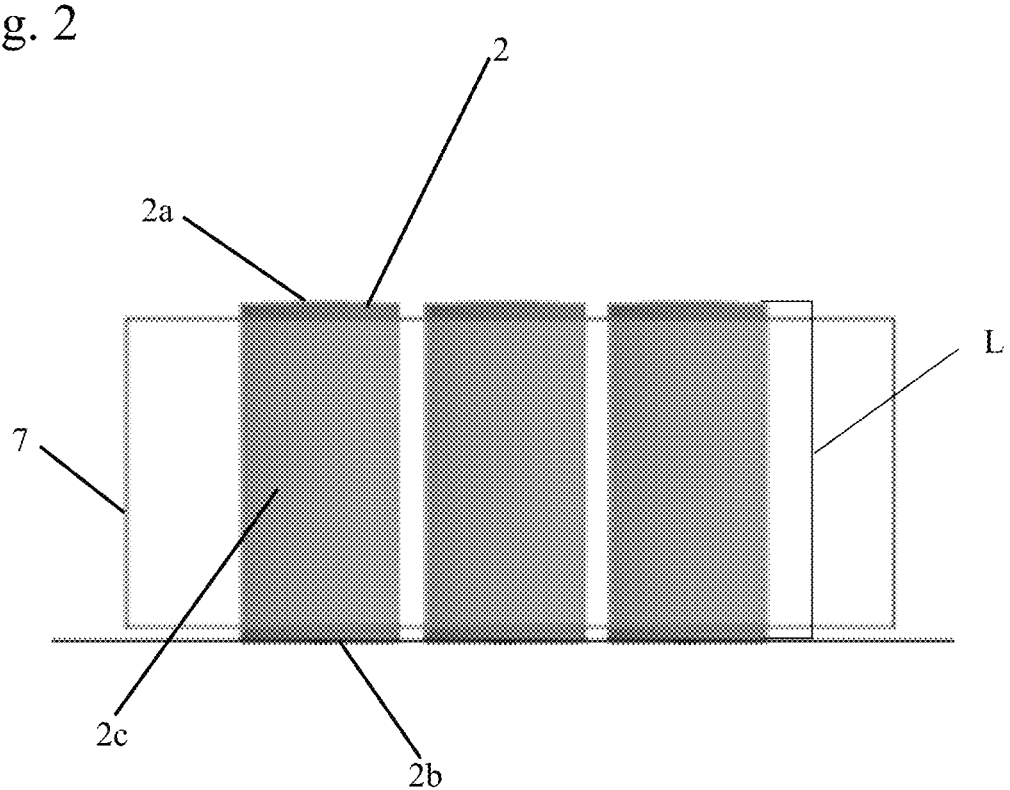
FIG. 2 shows a side view of carrier with an arrangement of contact elements.
Figure 3:
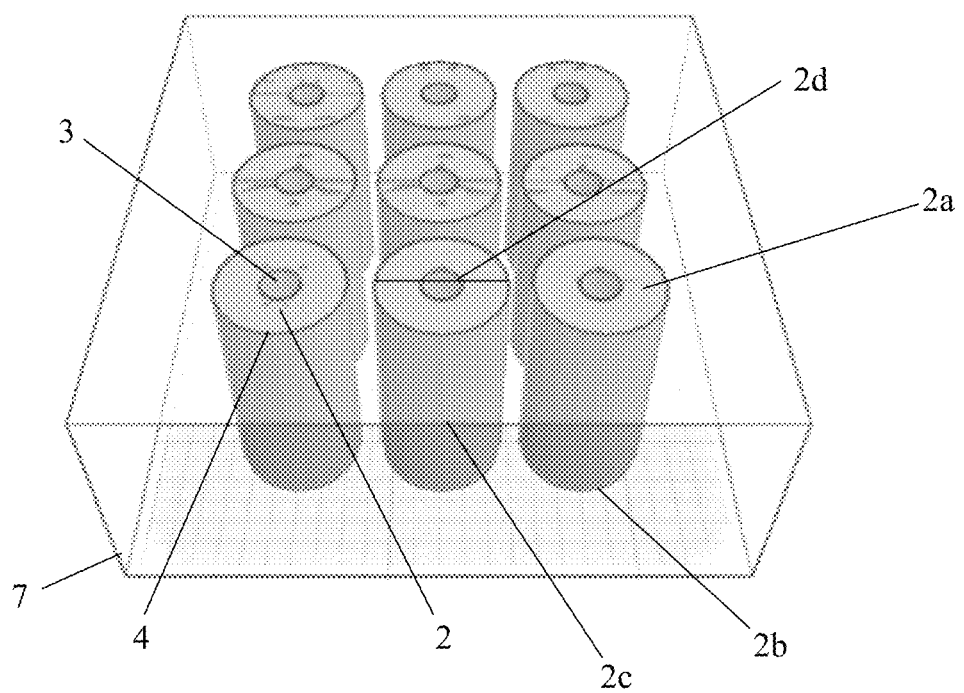
FIG. 3 shows a top perspective view of the carrier of FIG. 2.
Figure 4:
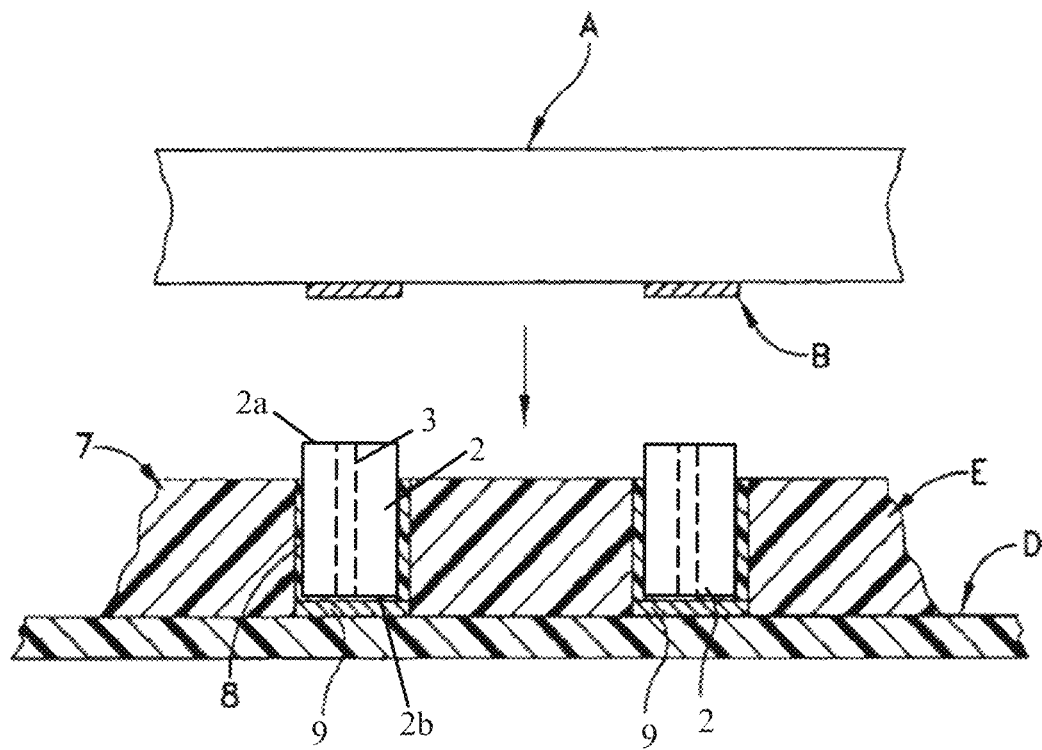
FIG. 4 shows a sectional view of an assembly of electronic components with contact elements.

This description of preferred embodiments is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship. In the claims, means-plus-function clauses are intended to cover the structures described, suggested, or rendered obvious by the written description or drawings for performing the recited function, including not only structural equivalents but also equivalent structures.

Referring to FIGS. 2-4 and 6, a contact element 2 of the embodiment of the present invention is present between electronic components, like computer chips (IC Package A) and printed circuit boards (PCB) D, or the connection between an electronic component in a test socket to provide high current, high density, and high frequency connections between the electronic components. The contact element 2 of an embodiment of the present invention is preferably an electrical contact. The terminology, electrical contact, is used herein interchangeably with the terminology, electrical contact element and contact element. The conductive contact element 2 preferably achieves a good connection between electrical components when they are connected and pressed together. The contact element 2 of the present invention is a replacement for metal springs, and metal connectors between electronic components A, D. The contact element 2 preferably allows electrical components A, D to be connected, and disconnected many times, with the contact element 2 retaining its spring-like capabilities, in addition to its electrical conductive properties.

The contact element 2 of an embodiment of the present invention preferably contains spring-like features such as resiliency and acts as an elastic object that stores mechanical energy and can be compressed or stretched from a resting position to exert an opposing force approximately proportional to its change in length.

The contact element 2 is preferably made of a conductive silicone rubber. The conductive silicone rubber can be a flexible, electrically conductive moisture curing RTV (Room Temperature Vulcanizing) silicone. For example, the conductive silicone rubber SS-26S from Silicon Solutions of Cuyahoga Falls, Ohio. The conductive silicone can be dispensed manually or automatically through dispensing equipment and has a thixotropic consistency. The conductive silicone rubber preferably has at least a volume resistivity of 0.005 Ohms-cm ($5 \times 10^{-3}$ Ohm/cm).

The contact element 2 has a first end 2a, a second end 2b, and an overall length L with an outer circumference 2c. A centralized hole 3 is preferably present within the contact element 2. The centralized hole 3 preferably extends from the first end 2a to the second end 2b. In other embodiments, the centralized hole 3 extends from the first end 2a a length towards the second end 2b shorter than the overall length L.

Figure 6:
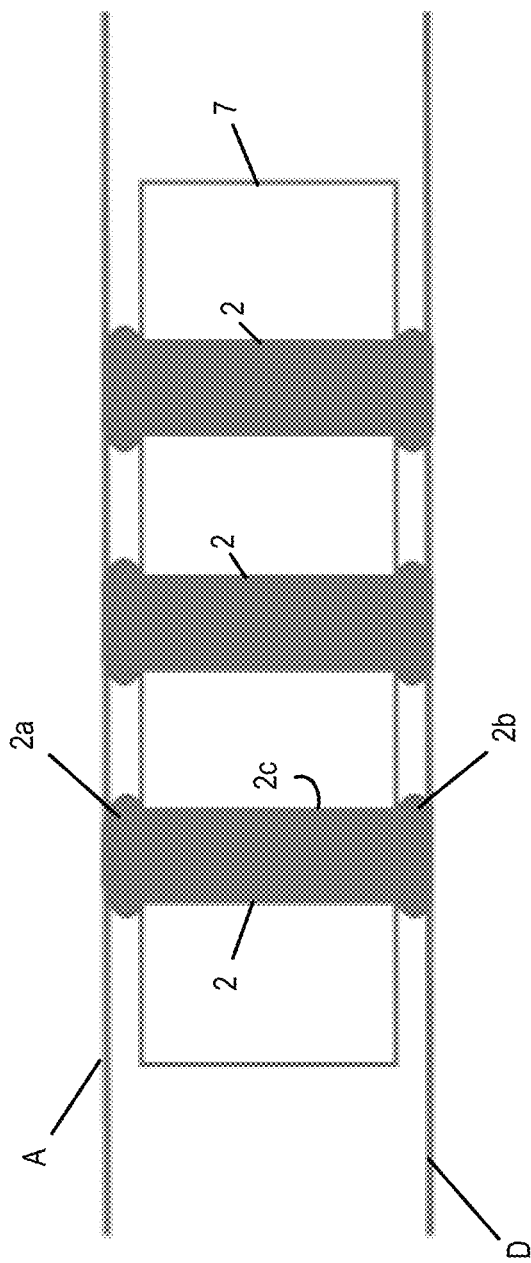
FIG. 6 shows a side view of the carrier with the arrangement of contact elements being compressed.

The silicone rubber of the contact element 2 is preferably plated 4 with a soft conductive metal. The plating can be carried out via electroplating, electroless (chemical) plating, or a combination of electroless (chemical) plating and then electroplating. The conductive metal can include, but is not limited to copper, gold, silver or platinum. A thin layer of plating 4 over the contact element 2 allows the plating 4 to bend along with the silicone contact element when the electronic components parts A, D are joined together and the silicone contact element 2 is compressed between said components A, D, while at the same time providing improved electrical conductivity as shown in FIG. 6.

The centralized hole 3 in the contact element 2 allows for plating 4 of the entire element 2 so that there is additional conductivity from the first end 2a to the second end 2b of the silicone contact element 2, and through the middle of the silicone contact element 2, to allow for a better electrical connection across the outer circumference 2c of the contact element 2.

The contact elements 2 are received on or within a surface of a carrier 7 referred to as a housing E, in a specific arrangement. The specific arrangement is a pattern which corresponds to a specific component pin hole configuration necessary to adequately support the electrical components and ensure an adequate electrical connection. While the carrier 7 is generically shown in the Figures, the carrier may be of any shape. The carrier 7 is typically made of plastic, or a similar non-conductive material. The specific arrangement can include a high density, narrow pitch pin arrangement.

Figure 5:
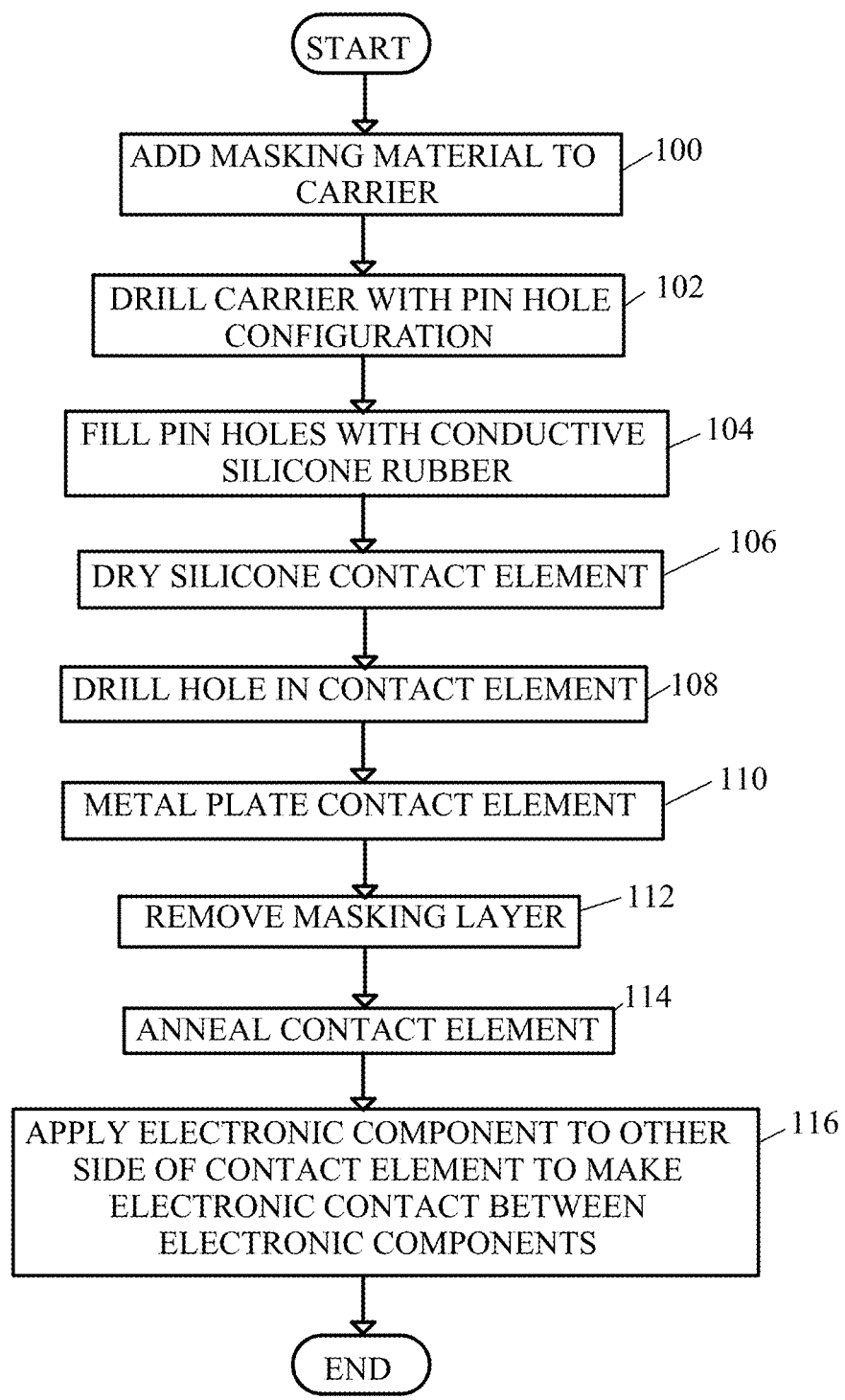
FIG. 5 shows a method of preparing a contact element.

Electrical components can be electronically connected by the method shown in FIG. 5. Optionally, a thin layer of wax, a plastic sheet, or other material 9 can be added to the carrier (Step 100). In one embodiment, this thin layer is removed at the end of the manufacturing process prior to using an additional electronic component to compress the contact element 2, so that the contact elements protrude from the carrier 7, ensuring that the contact elements retain their shape and desired pattern.

Then, a carrier 7 is drilled with a specific component pin hole configuration 8 (Step 102). The construction materials for the carrier 7 begin with a substrate including, but not limited to, epoxy/glass composite, a sheet or film, for example, of Kaepton (Kapton), filled polymer, photosensitive polymer, semiconductor wafer, and others. An epoxy/glass composite is a glass fiber reinforced epoxy substrate for a PCB. The holes 8 can be produced by drilling, laser drilling or a selective photo etch process. In general the location of a hole 8 is more precisely located when produced by a photo etch process compared to being produced by mechanical drilling or laser drilling. A photosensitive polymer is useful in the case where high precision in retention hole 8 location is desired, and obtained by masking selected parts of the photo-exposure polymer, then, photo-exposure of unmasked parts of the photo-sensitive polymer to photo-develop the same, followed by washing away the undeveloped photo-sensitive polymer, leaving a patterned mask, followed by etching an under layer of the substrate exposed by the patterned mask. Next, the pin holes 8 are filled with conductive silicone rubber which forms the contact element 2 (Step 104). The silicone acts as a glue, so that rather than gluing or attaching a contact element 2 in a carrier 7, the silicone is injected into the pin holes 8 in the carrier 7 and silicone itself becomes the adhesive and the contact element 2 all in one. This improves the surface area and volume of the contact element 2 well beyond the surface area and volume of a spring, or of multiple wires that comprise a prior art contact element. Because of the increased volume over traditional wires/springs, the resistance is much lower, providing a contact element 2 that can support the higher frequency needs of electronic components A, D.

After the conductive silicone rubber of the contact element 2 has dried (Step 106), a centralized hole 3 is drilled or punched (Step 108). The hole 3 preferably has a smaller diameter than the diameter of the pin hole 8 configuration, such that a hollow or partially hollow cylinder of conductive silicone is remaining. The hole 3 allows for plating of the entire contact element 2 so that there is additional conductivity from each side of the contact element 2 and through the middle of the contact element 2 to allow for a better electrical connection across the outer diameter 2d of the contact element 2. The diameter of the hole 3 can be a multitude of sizes and be drilled with a laser cutter or other drilling apparatus. Since the hole size can vary, the number or pins and the specific configuration of the pins can be customized per application.

Next, the silicone contact element 2 is plated. The plating can be electroplated only, electroless plating (chemical) only, a combination of electroplating and electroless plating to increase adhesion (Step 110). The plating of the contact element 2 improves electrical conductivity of the silicone and reduces the force required to make a suitable electronic connection between electronic components A, D in comparison to just using conductive silicone. The plating is carried out using a soft metal such as, but not limited to copper, tin, gold, and platinum. Plating of the silicone contact element 2 preferably results in a volume resistivity within a range between 0.005-0.00000172 Ohm/cm.

At this point in the process, the thin layer of masking material 9, if applied is removed (Step 112). The masking material can be wax or a plastic masking sheet. It should be noted that in this embodiment, the first end 2a of the contact element 2, the outer circumference 2c of the contact element 2 and the centralized hole 3 are plated.

It should be noted that in an alternate embodiment, the thin layer of masking material is removed prior to electroplating. In this embodiment, the entire contact element 2 of the first end 2a, the second end 2b, the outer circumference 2c and the centralized hole 3 is plated. Therefore, step 112 of removing the wax layer is moved to be after step 108 of drilling a hole in the contact element 2.

In a preferred embodiment, masking material is not removed until after electroless plating is completed.

In one embodiment, the silicone contact element is copper plated, as copper provides low resistance and anneals at a relatively low temperature. In this embodiment, the copper plated silicon contact element has an approximate volume resistivity of 0.00000172 Ohm/cm ($1.72 \times 10^{-6}$ Ohm/cm).

Optionally, the electroplated contact element 2 is annealed (Step 114). The annealing process hardens the plating material and aids in ensuring that the contact element 2 returns to the original or resting shape after compression.

It should be noted that with the improved conductivity, the portion of the contact member 2 that protrudes from the carrier 7 does not need to be very large to make a connection.

After the contact elements 2 are electroplated 4, the electronic component A is applied to the carrier 7, and the contact elements 2, with force to provide an electronic connectivity (Step 116) and the method ends.

When completed, the result will be a carrier 7 with a metal plated silicone spring contact elements 2 designed to the specification required by the application. These silicone contact elements 2 are adhered to the carrier 7 and do not require any type of special adhesive to keep them in place.

The carrier 7 defines the contact pattern of the electronic package. The silicone contact element 2 provides the necessary force/compliance to achieve a good connection between the different parts, in addition to providing the electrical contact between components A, D. The metal plating improves the contact resistance beyond the electrical performance of the conductive silicone.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A method of connecting electronic components for electronic connectivity comprising:
   drilling a carrier attached to a first electronic component with a pin hole configuration having at least one pin hole;
   filling each of the at least one pin holes with a contact element of conductive silicone rubber, such that a first end of the of the contact element contacts the first electronic component;
   drying the contact element of conductive silicone rubber;
   drilling a centralized hole in each contact element of conductive silicone rubber;
   plating the contact element; and
   applying a second electronic component to a second end of the contact element, opposite the first side with a force, such that electrical connectivity is established between the first electronic component and the second electronic component.

2. The method of claim 1, further comprising adding a thin layer of masking to the carrier prior to drilling the carrier with the pin hole configuration.

3. The method of claim 2, further comprising removing the thin layer of masking after plating the contact element.

4. The method of claim 2, further comprising removing the thin layer of masking prior to plating the contact element.

5. The method of claim 3, wherein the plating is electroplating.

6. The method of claim 4, wherein the plating is electroplating.

7. The method of claim 1, wherein the plating is selected from a group consisting of: electroplating only, electroless plating and electroplating, and electroless plating only.

8. The method of claim 1, wherein the centralized hole extends from the first end of the contact element to the second end of the contact element.

9. The method of claim 1, wherein the centralized hole extends a partial length of the contact element.

10. The method of claim 1, wherein the plating deposits a soft conductive metal on an outer circumference, the first end, the second end, and the centralized hole of the contact element.

11. The method of claim 10, wherein the metal is selected from a group consisting of: copper, tin, gold and platinum.

12. The method of claim 1, wherein the conductive silicon rubber is flexible, electronically conductive, moisture curing, room temperature vulcanizing silicone rubber.

13. The method of claim 1, wherein at least one of the first electronic component or the second electronic component is removeable.

14. The method of claim 1, wherein adhesive is not required between the first electronic component, the contact element and the second electronic component.

15. The method of claim 1, wherein the silicone contact elements are adhered to the carrier.

16. The method of claim 1, wherein the contact element, after plating, has at least a volume resistivity of 0.005-0.00000172 Ohms-cm.

* * * * *